United States Patent [19]

Arima et al.

[11] Patent Number: 5,093,277
[45] Date of Patent: Mar. 3, 1992

[54] METHOD OF DEVICE ISOLATION USING POLYSILICON PAD LOCOS METHOD

[75] Inventors: Hideaki Arima; Natsuo Ajika, both of Hyogo, Japan

[73] Assignee: Mitsubishi Denki Kabushiki Kaisha, Tokyo, Japan

[21] Appl. No.: 487,322

[22] Filed: Mar. 2, 1990

[30] Foreign Application Priority Data

Mar. 9, 1989 [JP] Japan ................... 1-56722
Oct. 11, 1989 [JP] Japan ................... 1-264152

[51] Int. Cl.⁵ .............................................. H01L 21/76
[52] U.S. Cl. .................................................... 437/69
[58] Field of Search ........................ 437/69; 156/657

[56] References Cited

U.S. PATENT DOCUMENTS

| | | | |
|---|---|---|---|
| 4,180,432 | 12/1979 | Clark | 156/657 |
| 4,407,696 | 10/1983 | Han et al. | 156/653 |
| 4,755,477 | 7/1988 | Chao | 437/62 |
| 4,897,364 | 1/1990 | Nowyen et al. | 437/69 |
| 4,948,461 | 8/1990 | Chatterjee | 156/646 |

FOREIGN PATENT DOCUMENTS

| | | | |
|---|---|---|---|
| 54-007882 | 1/1979 | Japan | 437/69 |
| 57-80779 | 5/1982 | Japan | |
| 61-74350 | 4/1986 | Japan | 437/69 |
| 62-60232 | 3/1987 | Japan | |
| 62-183139 | 8/1987 | Japan | |
| 63-302536 | 12/1988 | Japan | |

OTHER PUBLICATIONS

Han et al., "Isolation Process Using Polysilicon Buffer Layer for Scaled MOS/VLSI," *ECS Extended Abstracts*, 84-1, Abstract No. 67, p. 90, 1984.

Hoshi et al., "1.0 μm CMOS Process for Highly Stable Tera-Ohm Polysilicon Load 1Mb SRAM," *IEEE International Electron Devices Meeting 86*, pp. 300-303 (1986).

Primary Examiner—Olik Chaudhuri
Assistant Examiner—G. Fourson
Attorney, Agent, or Firm—Lowe, Price, LeBlanc & Becker

[57] ABSTRACT

Here is disclosed an improved polysilicon pad LOCOS method. An underlying oxide film is formed on a main surface of a semiconductor substrate. Over the underlying oxide film, polysilicon to be a field oxide film is then deposited. Subsequently, a nitride film is formed on the polysilicon. Thereafter, the nitride film is patterned to leave patterns of a predetermined configuration in an area to be a device region. Using the patterned nitride film as a mask, the polysilicon other than a portion beneath the mask is thermally oxidized to form a field oxide film on the main surface of the semiconductor substrate. The nitride film having served as a mask is then removed to expose the unoxidized polysilicon remaining under the mask. Subsequently, the unoxidized polysilicon is etched away under predetermined conditions which do not allow any etching of the underlying oxide film. According to the present method, it is possible to increase the film thickness of the field oxide film without opening any hole in the surface of the semiconductor substrate. As a result, a highly integrated semiconductor device can be obtained.

15 Claims, 8 Drawing Sheets

○ NO HOLE GENERATED
× HOLES GENERATED
△ A FEW HOLES GENERATED

METHOD OF DEVICE ISOLATION USING POLYSILICON PAD LOCOS METHOD

BACKGROUND OF THE INVENTION

1. Field of the Invention

The present invention generally relates to methods of device isolation using a polysilicon pad LOCOS method, and more particularly, to an improved polysilicon pad LOCOS method which allows a field oxide film to be increased in thickness without forming any hole in the surface of a semiconductor substrate.

2. Description of the Background Art

The LOCOS method developed by Philips Company Incorporated is well-known as a method for forming a field oxide film which isolates device regions on a main surface of a semiconductor substrate. According to this method, however, a bird's beak whose length is substantially equal to the film thickness of the field oxide film is formed, and this has given limitations in manufacturing a device of a high-integration level. Therefore, an improved polysilicon pad LOCOS method as shown in FIGS. 2A to 2F has been proposed (U.S. Pat. No. 4,407,696).

First, the conventional polysilicon pad LOCOS method will be briefly described. Referring to FIG. 2A, an underlying oxide film 2 is formed on a main surface of a semiconductor substrate 1. Polysilicon 3 is deposited over the underlying oxide film 2 so as to be a field oxide film, on which a nitride film 4 ($Si_3N_4$) is formed. Furthermore, a resist 5 is formed on the nitride film 4.

Secondly, referring to FIG. 2B, the resist 5 is patterned by the lithography method to leave patterns of a predetermined configuration in an area to be a device region. Subsequently, using this patterned resist 5 as a mask, the nitride film 4 is patterned by the reactive ion etching method to leave patterns of a predetermined configuration in the area to be a device region.

Furthermore, referring to FIG. 2C, using the patterned nitride film 4 as a mask, the polysilicon is thermally oxidized except a portion beneath the mask, forming a field oxide film 6 on the main surface of the semiconductor substrate 1.

Referring to FIGS. 2C and 2D, the nitride film 4 which has served as the mask is eliminated to expose the unoxidized polysilicon 3 remaining beneath the mask.

Referring to FIG. 2E, the unoxidized polysilicon 3 is etched away by plasma etching to expose the underlying oxide film 2 surrounded by the field oxide film 6.

Finally, referring to FIG. 2F, the underlying oxide film 2 surrounded by the field oxide film 6 is etched off by a hydrofluoric acid solution.

By adopting this process, the field oxide film 6 is formed with bird's beaks shortened in length. In the device region isolated by such a field oxide film 6, for example, an NMOS, an EEPROM and the like are formed.

FIGS. 3A to 3B show a process for forming an NMOS in a device region.

Referring to FIG. 3A, an oxide film 7 is formed on a main surface of a semiconductor substrate 1 to be a gate oxide film. Polysilicon 8 is then deposited over the entire surface of the semiconductor substrate 1 to form a gate.

Subsequently, referring to FIG. 3B, the polysilicon 8 and the oxide film 7 are patterned to form a gate electrode 9 and a gate oxide film 10.

Furthermore, referring to FIG. 3C, $n^+$ impurity ions 30 are implanted in the entire surface in a self-aligned manner to form source/drain regions 11 in the main surface of the semiconductor substrate 1.

Referring to FIG. 3D, an interlayer insulating film 12 is formed over the entire surface of the semiconductor substrate 1. Subsequently, contact holes are formed in this interlayer insulating film 12 to expose contact portions for the source/drain regions 11. An aluminum interconnection layer 13 is then formed over the entire surface of the semiconductor substrate 1 including the contact holes. In this manner, the NMOS is formed in the device region. This NMOS has a switching function, since its source/drain regions 11 and 11 are electrically connected when a predetermined voltage is applied to the gate electrode 9. In this case, the thicker the field oxide film 6 is, the more improved break-down voltage can be expected in the NMOS.

Subsequently, a description will be made on a case where a memory cell of an EEPROM is formed in a device region.

FIG. 4 is a sectional view showing a structure of the memory cell in a conventional EEPROM.

There is formed a field oxide film (not shown in the drawing) on a main surface of a semiconductor substrate 1 formed of a P-type silicon substrate. N-type impurity regions 14, 15 and 16 are formed with predetermined spacings in a device region isolated by the field oxide film. Above an area between the impurity regions 14 and 15 there is formed a selective gate 18 of a selective transistor with an insulating film 17 interposed therebetween. Above the impurity region 15 there is formed a floating gate 20 of a memory transistor with a thin insulating film 19 interposed therebetween to be a tunnel oxide film. Furthermore, on the floating gate 20, there is formed a control gate 21 of the memory transistor with an insulating film 22 interposed therebetween. The selective gate 18, the floating gate 20 and the control gate 21 are all covered with an insulating film 24. The N-impurity region 14 to be a drain region of the selective transistor is connected to a bit line (not shown) while the N-type impurity region 16 to be a source region of the memory transistor is connected to a source line (not shown).

Now, operation of the memory cell will be described. In erasing, that is, in introducing electrons into the floating gate 20, a word line is selected and a high voltage is applied to the selective gate in order to select a cell. Subsequently, when the bit line and the source line are set to 0 V and a high voltage is applied to the control gate 21, electrons are introduced into the floating gate 20 from the drain 15 through the tunnel oxide film 19.

In writing, that is, in extracting the electrons from the floating gate 20, a word line is selected and a high voltage is applied to the selective gate in order to select a cell. Subsequently, with the source line floating, when the control gate 21 is set to 0 V and a high voltage is applied to the bit line, the electrons in the floating gate 20 are extracted into the drain 15 through the tunnel oxide film 19.

In reading, a word line is selected and a high voltage is applied to the selective gate in order to select a cell. Subsequently, the source line is set to 0 V, a positive voltage is applied to the bit line and a bias voltage for reading is applied to the control gate 21. Since the drain current varies depending on the presence or absence of stored charges in the floating gate 20, stored information of "1" or "0" is read out by sensing the variation.

The conventional EEPROM is constituted as described above. Meanwhile, since in the EEPROM the writing voltage is large, it is required for the field oxide film which isolates devices to be increased in thickness. A more than 6000 Å thickness is presently required for the field oxide film.

The experimental facts on which the present invention is based will be described hereinafter.

FIGS. 5A to 5D are diagrams showing results of an experiment where a thickness of a field oxide film is 6000 Å and that of a silicon nitride film is 1500 Å.

Referring to FIG. 5A, using a patterned nitride film as a mask, polysilicon other than a portion beneath the mask was thermally oxidized to form a field oxide film 6 on a main surface of a semiconductor substrate 1. At this stage, there appeared horn-like protrusions 6a extending inwardly at ends of the field oxide film 6.

Referring to FIG. 5B, the nitride film 4 having served as the mask was removed to expose the unoxidized polysilicon 3 remaining beneath the mask. At this stage, the horn-like protrusions 6a remained left. If an EEPROM or the like is formed in the device region with such protrusions 6a remaining, there arises a problem that electrode material and the like under the protrusions 6a cannot be removed. Therefore, these protrusions 6a were removed with hydrofluoric acid solution.

FIG. 5C is a diagram showing the field oxide film after the protrusions 6a were removed with hydrofluoric acid solution.

Furthermore, referring to FIGS. 5C and 5D, the unoxidized polysilicon 3 was removed by plasma etching.

Referring to FIG. 5D, an underlying oxide film 2 surrounded by the field oxide film 6 was removed with hydrofluoric acid solution. It was recognized that holes 23 had been opened in the main surface of the semiconductor substrate 1 as shown in FIG. 5D.

Such holes 23 have proven to considerably deteriorate characteristics of an NMOS or the like which may be formed in this device region.

In the following, reasons why the holes 23 were formed in the device region will be fully discussed. FIGS. 6A to 6E are diagrams clearly showing the facts which have been found as a result of investigation of the causes that the holes are formed in a surface of a semiconductor substrate 1.

Referring to FIG. 6A, using a patterned nitride film 4 as a mask, polysilicon other than a portion beneath the mask is thermally oxidized to form a field oxide film 6 on a main surface of a semiconductor substrate 1. At this stage, the unoxidized polysilicon 3 gets distorted under the influence of cubical expansion of the field oxide film 6 and thermal stress of the nitride film 4. This distortion causes formation of holes 3a, which pass through the unoxidized polysilicon 3, to reach the underlying oxide film 2.

Referring to FIG. 6B, the nitride film 4 having served as a mask is removed to expose the unoxidized polysilicon 3 remaining beneath the mask. Subsequently, when horn-like protrusions 6a are removed with hydrofluoric acid solution, the hydrofluoric acid solution reaches even to the underlying oxide film 2 through the holes 3a. Consequently, as shown in FIG. 6C, openings 2a are formed in the underlying oxide film 2.

Referring to FIG. 6D, when plasma etching is performed to remove the unoxidized polysilicon 3, the etching gas passes through the openings 2a in the underlying oxide film 2 and the main surface in the device region of the semiconductor substrate 1 is also etched.

Furthermore, referring to FIGS. 6D and 6E, removal of the underlying oxide film surrounded by the field oxide film 6 with the use of hydrofluoric acid solution was carried out. As a result, the semiconductor substrate 1 having the holes 23 opened in the main surface of the device region is obtained.

A number of such holes 23 have also proven to appear in the vicinity of edges 6a of the field oxide film 6 as seen in FIG. 7 (a plan view of FIG. 5D).

FIG. 8 is a diagram showing the results of a test as to whether holes have been produced in a device region, using a variety of thickness of the field oxide film which has been obtained by diversifying the thickness of the silicon nitride film. As will be apparent from the diagram, while an ideal field oxide film with bird's beaks reduced in length could be obtained if the field oxide film was thickened to 6000 Å or more by making the silicon nitride film 1500 Å thick or more, there was also recognized formation of the holes in the main surface of the semiconductor substrate. Meanwhile, in the case of a 500 Å thick silicon nitride film and a 8000 Å thick field oxide film, the formation of holes were not recognized, but the bird's beaks were increased in length so that the resultant device was useless.

SUMMARY OF THE INVENTION

An object of the present invention is to provide a field oxide film which has a larger thickness and bird's beaks reduced in length, with a method of device isolation using the polysilicon pad LOCOS method.

Another object of the present invention is to make a field oxide film larger in thickness without opening a hole in a main surface of a semiconductor substrate, with a method of device isolation using the polysilicon pad LOCOS method.

A further object of the present invention is to provide a field oxide film of a 6000 Å or more thickness without opening a hole in a main surface of a semiconductor substrate, with a method of device isolation using the polysilicon pad LOCOS method.

Still another object of the present invention is to provide a semiconductor device having an enhanced break-down voltage and a higher-integration level, by use of an improved polysilicon pad LOCOS method.

Still a further object of the present invention is to provide an EEPROM having a field oxide film of a 6000 Å or more thickness, an enhanced break-down voltage and a higher-integration level, by use of an improved polysilicon pad LOCOS method.

We have recognized the facts as shown in FIGS. 5A to 5D and has accomplished the present invention, as a result of our hard study on a method which does not produce any hole in a main surface of a semiconductor substrate. More specifically, the present invention relates to a method of device isolation in which a field oxide film isolating device regions is formed on a main surface of a semiconductor substrate. First, an underlying oxide film is formed on a main surface of a semiconductor substrate. Polysilicon is then deposited on the underlying oxide film to form a field oxide film. Thereafter, a nitride film is formed on the polysilicon. Subsequently, the nitride film is patterned to leave patterns of a predetermined configuration in an area to be a device region. Using the patterned nitride film as a mask, the polysilicon other than a portion beneath the mask is thermally oxidized to form a field oxide film on the main surface of the semiconductor substrate. The nitride film having served as the mask is then removed to expose the unoxidized polysilicon remaining beneath the mask. Subsequently, this unoxidized polysilicon is removed by an etching having a selectivity which meets the following inequality:

$$\frac{T_{SiO_2}}{R_{SiO_2}} > \frac{T_{poly}}{R_{poly}}.$$

(In the inequality, $T_{SiO_2}$ represents film thickness of the underlying oxide film, $R_{SiO_2}$ etching rate of the underlying oxide film, $T_{poly}$ film thickness of the unoxidized polysilicon and $R_{poly}$ etching rate of the unoxidized polysilicon).

According to a preferred embodiment of the present invention, the etching of the unoxidized polysilicon is performed by plasma etching. Furthermore, the plasma etching is preferably performed with a mixed gas comprising CF$_4$ and O$_2$ under the conditions of gas pressure of 0.1 to 1.0 Torr, RF power of 0.1 to 1.0 W/cm$^2$ and substrate temperature of 50° C. or less. In this case, it is preferable that the film thickness of the nitride film is in a range of 800 to 2000 Å, that of the polysilicon is in a range of 500 to 2000 Å and that of the underlying oxide film is in a range of 150 to 500 Å.

According to the present invention, the unoxidized polysilicon is removed by an etching having a selectivity which meets the following inequality:

$$\frac{T_{SiO_2}}{R_{SiO_2}} > \frac{T_{poly}}{R_{poly}}.$$

In the inequality, $T_{SiO_2}/R_{SiO_2}$ represents a time taken to completely removed the underlying oxide film by etching and $T_{poly}/R_{poly}$ represents a time required to completely remove the unoxidized polysilicon. Since the time required to completely remove the underlying oxide film is longer than that taken to completely remove the unoxidized polysilicon in the etching under such conditions, the underlying oxide film remains left on the main surface of the semiconductor substrate 1 even after the complete removal of the unoxidized polysilicon. Therefore, even if any hole is produced in the unoxidized polysilicon, the main surface of the semiconductor substrate cannot be damaged by the etching.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
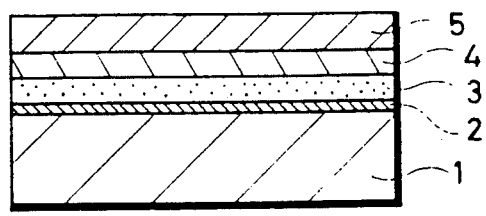
FIGS. 1A to 1F are sectional views showing a process according to an embodiment of the present invention.

Referring to FIG. 1A, an underlying oxide film 2 was formed on a semiconductor substrate 1. Over the underlying oxide film 2, polysilicon 3 to be a field oxide film later was deposited. On the polysilicon 3, a nitride film 4 (silicon nitride film) having a 1500 Å or more thickness was formed, on which a resist 5 was further formed.

Figure 1B:
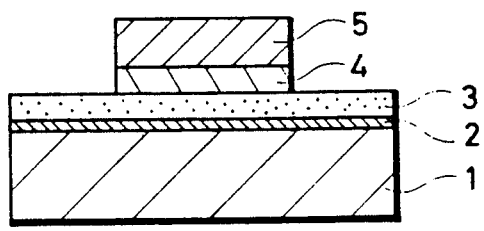

Referring to FIG. 1B, the resist 5 was patterned to leave patterns of a predetermined configuration in an area to be a device region. Using the patterned resist 5 as a mask, the nitride film 4 was patterned to be of a predetermined configuration.

Figure 1C:
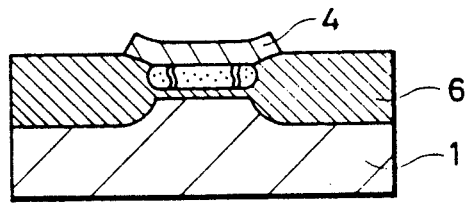

Furthermore, referring to FIG. 1C, the resist 5 was removed and, using the patterned nitride film 4 as a mask, the polysilicon 3 other than a portion beneath the mask was thermally oxidized to form a field oxide film 6 on the main surface of the semiconductor substrate 1.

Figure 1D:
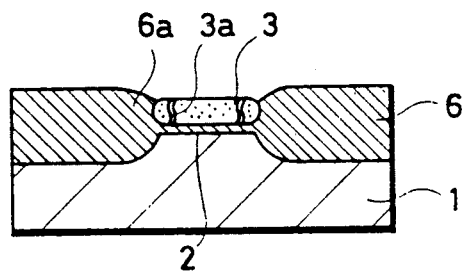

Referring to FIGS. 1C to 1D, the nitride film 4 having served as the mask was removed to expose the unoxidized polysilicon 3 remaining beneath the mask. At this stage, in the unoxidized polysilicon 3 there were opened holes 3a passing through the unoxidized polysilicon 3 to reach the underlying oxide film 2. Additionally, there appeared horn-like protrusions 6a extending inwardly at edges of the field oxide film 6.

Figure 1E:
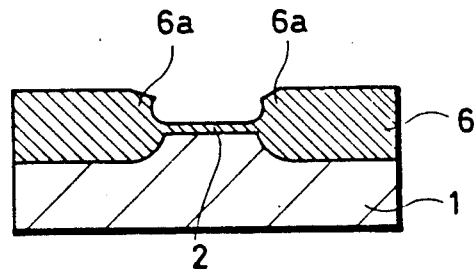

Referring to FIG. 1E, the unoxidized polysilicon was etched away by a plasma etching having a selectivity which meets the following inequality:

$$\frac{T_{SiO_2}}{R_{SiO_2}} > \frac{T_{poly}}{R_{poly}}$$

(In the inequality, $T_{SiO_2}$ represents film thickness of the underlying oxide film, $R_{SiO_2}$ etching rate of the underlying oxide film, $T_{poly}$ film thickness of the unoxidized polysilicon and $R_{poly}$ etching rate of the unoxidized polysilicon). The etching selectivity meeting the condition described above is controlled by plasma etching temperature, pressure, gas species, power and the like. The preferable conditions for a plasma etching with such a selectivity are shown in the Table 1.

TABLE 1

| gas species | CF$_4$ + O$_2$ |
|---|---|
| gas pressure (Torr) | 0.1~1.0 |
| RF power (W/cm$^2$) | 0.1~1.0 |
| substrate temperature (°C.) | 50° C. or less |

Furthermore, for this plasma etching, the preferred thicknesses of the nitride film 4, the polysilicon 3 and the underlying oxide film 2 are shown in the Table 2.

TABLE 2

|  | Range of preferred film thickness ( Å ) |
|---|---|
| nitride film | 800 ~ 2000 |
| polysilicon | 500 ~ 2000 |
| underlying oxide film | 150 ~ 500 |

When the conditions of gas species of $CF_4$ (95%)/$O_2$ (5%), gas pressure of 0.4 Torr, RF power of 0.5 W/cm$^2$ and substrate temperature of 50° C. were employed, a selectivity ratio of 10 or more was obtained. It has also been seen that the selectivity ratio is further increased with a substrate temperature of 20° C. or less.

Furthermore, the plasma etching may be replaced by a wet etching which is applied in a temperature range of 50° to 80° C. with alkali aqueous solution such as NaOH or KOH aqueous solution.

When a plasma etching or the like having such an etching selectivity is carried out, even if the hole 3a is produced in the unoxidized polysilicon, and the etching gas reaches the underlying oxide film 2 through the hole 3a, the underlying oxide film 2 remains left on the main surface of the semiconductor substrate 1 even after the complete removal of the unoxidized polysilicon, because the time required for etching away the underlying oxide film 2 completely is longer than the time required for etching away the unoxidized polysilicon completely. Therefore, there is no damaging of the main surface of the semiconductor substrate by the plasma etching.

Figure 1F:
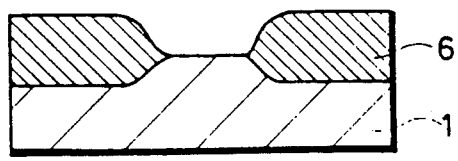

Subsequently, referring to FIG. 1F, removal of the underlying oxide film surrounded by the field oxide film 6 with hydrofluoric acid solution was carried out. As a result, the semiconductor substrate 1 is obtained which has the bird's beaks reduced in length, the field oxide film 6 of a larger thickness and no hole recognized. Furthermore, with this hydrofluoric acid solution treatment, the protrusions 6a are also eliminated.

With the use of a semiconductor substrate having device regions isolated by such a field oxide film, a semiconductor device having a higher-integration level and an enhanced break-down voltage is obtained.

Figure 1G:
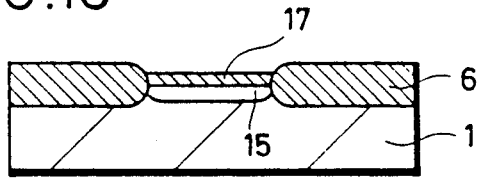
FIGS. 1G to 1R are sectional views showing a method of forming an EEPROM on a semiconductor substrate which has been obtained according to the present invention.

FIGS. 1G to 1L are sectional views showing a process of forming an EEPROM in the device region of the semiconductor substrate formed as described above. FIGS. 1G to 1L are sectional views cut along a plane including the field oxide film, while FIGS. 1M to 1R are sectional views cut along a plane vertical to the diagram plane of the corresponding FIGS. 1G to 1L. FIG. 1G corresponds to FIG. 1M, FIG. 1H to FIG. 1N, FIGS. 1I to FIG. 1O, FIG. 1J to FIG. 1P, FIG. 1K to FIG. 1Q and FIG. 1L to FIG. 1R.

Figure 1M:
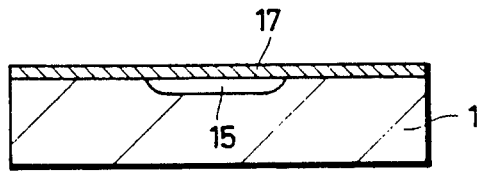

Referring to FIGS. 1G and 1M, an oxide film 17 is formed in an active region. Thereafter, n-impurity ions are implanted to form an N-type impurity region 15 in a main surface of the active region.

Figure 1H:
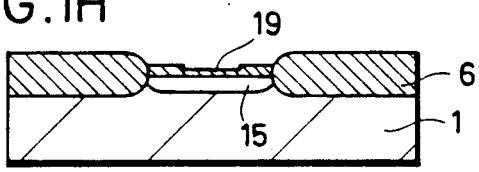
Figure 1N:
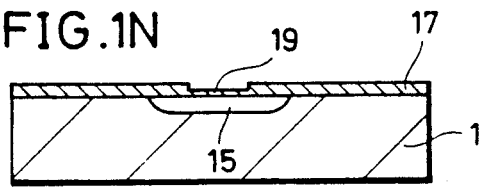

Referring to FIGS. 1H and 1N, a partial surface of the oxide film 17 is removed to form a thin insulating film 19.

Figure 1I:
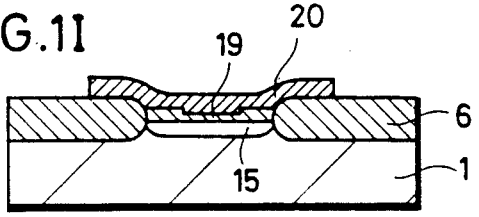
Figure 1O:
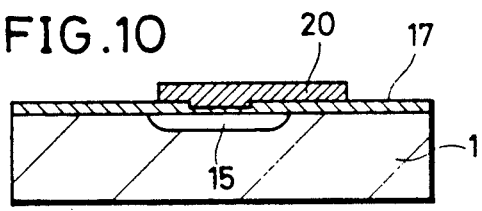

Referring to FIGS. 1I and 1O, a floating gate 20 of a predetermined configuration is formed to cover the thin insulating film 19.

Figure 1J:
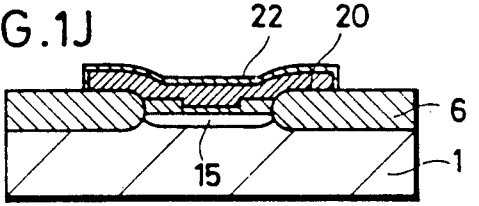
Figure 1P:
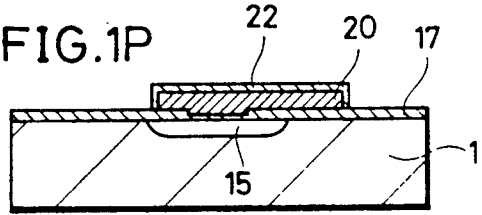

Thereafter, referring to FIGS. 1J and 1P, an insulating film 22 is formed to cover the surface and sidewalls of the floating gate 20.

Figure 1K:
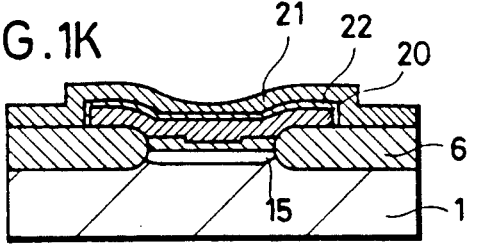
Figure 1Q:
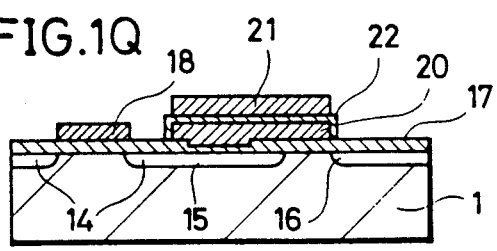

Referring to FIGS. 1K and 1Q, a control gate 21 of a predetermined configuration is formed to cover the insulating film 22. Subsequently, by implanting N-type impurity ions, N-type impurity regions 14 and 16 are formed in a self-aligned manner in the main surface of the semiconductor substrate 1.

Figure 1L:
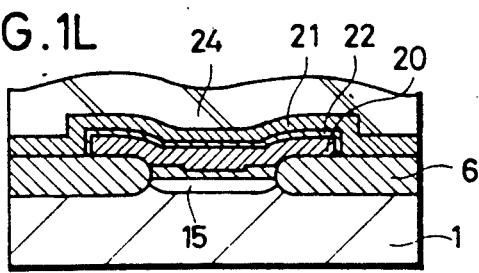
Figure 1R:
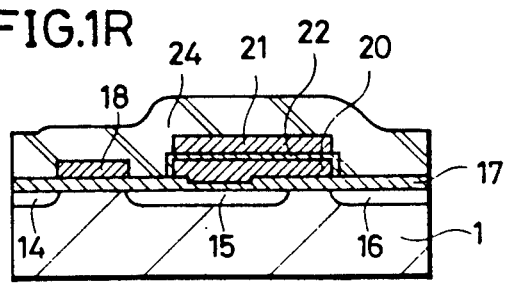
Figure 2A:
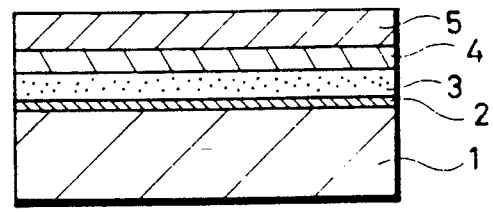
FIGS. 2A to 2F are sectional views showing a process of the conventional polysilicon pad LOCOS method.
Figure 2B:
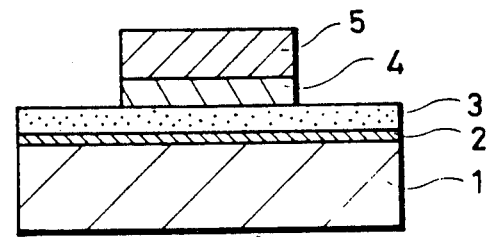
Figure 2C:
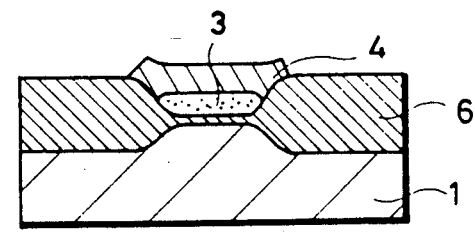
Figure 2D:
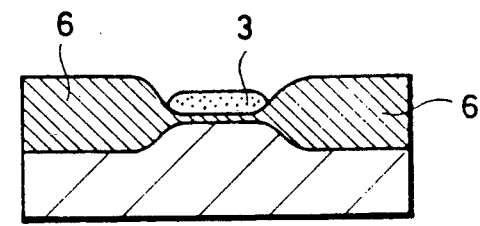
Figure 2E:
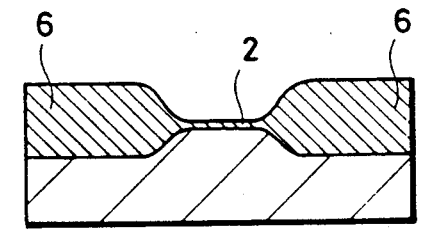
Figure 2F:
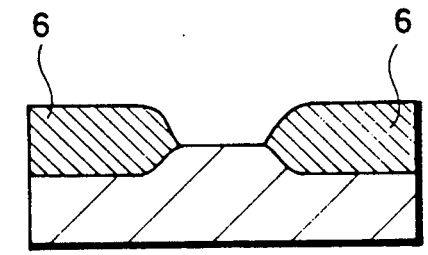
Figure 3A:
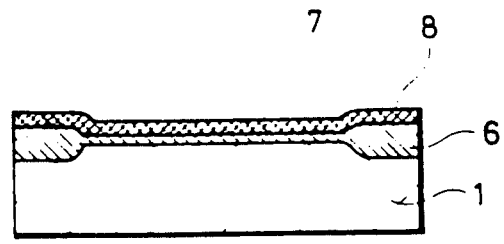
FIGS. 3A to 3D are diagrams showing a process of forming an NMOS in a device region.
Figure 3B:
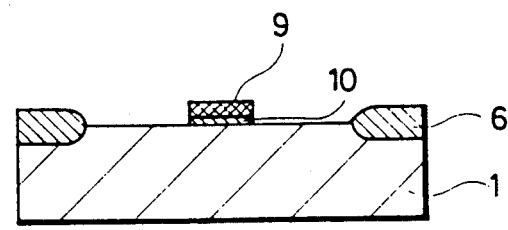
Figure 3C:
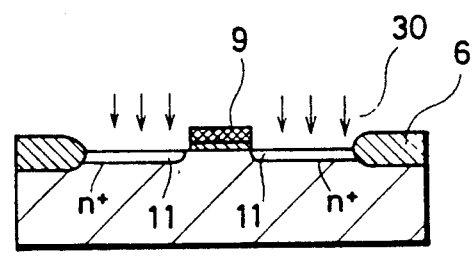
Figure 3D:
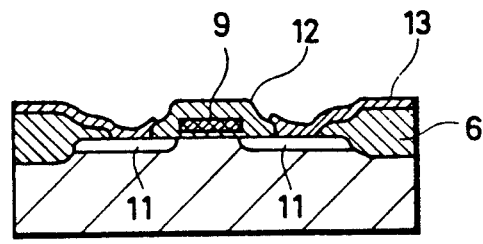
Figure 4:
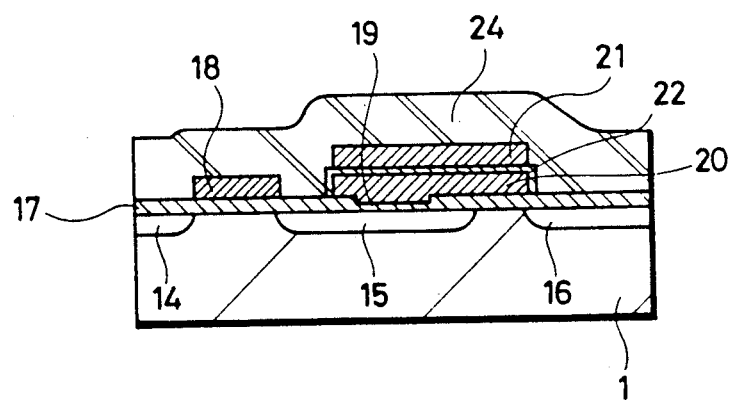
FIG. 4 is a sectional view of a memory cell of an EEPROM formed in a device region.
Figure 5A:
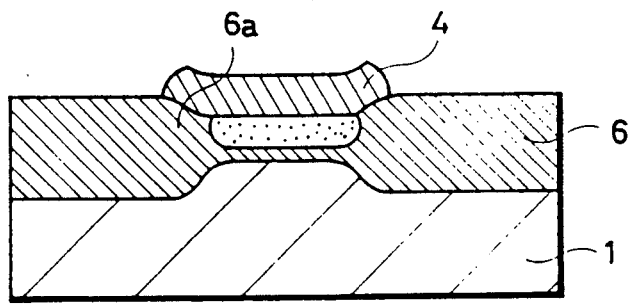
FIGS. 5A to 5D are sectional views showing a process of an experiment on which the present invention is based.
Figure 5B:
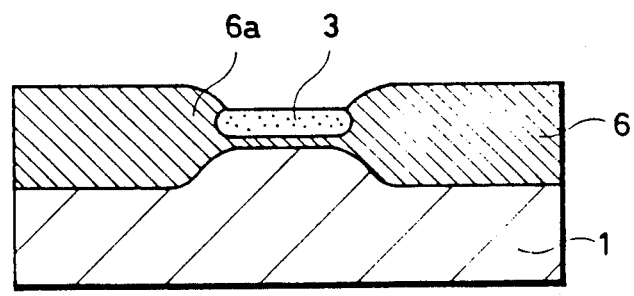
Figure 5C:
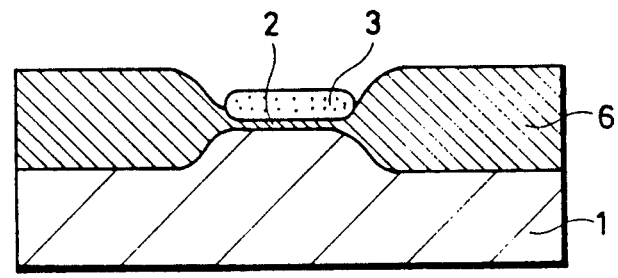
Figure 5D:
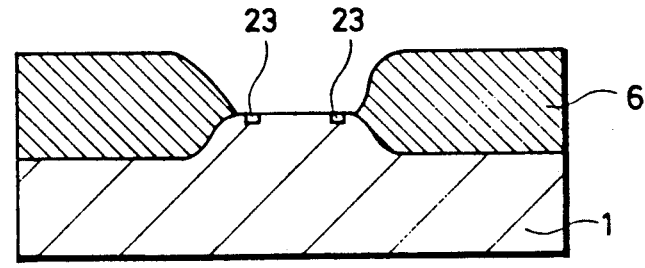
Figure 6A:
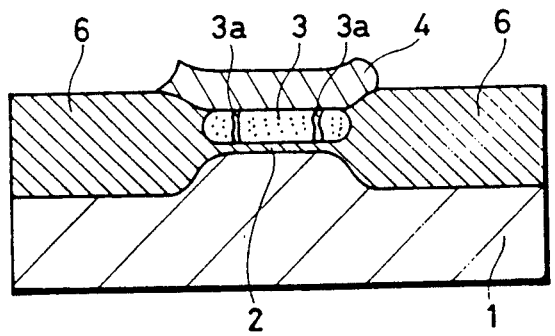
FIGS. 6A to 6E are diagrams showing the results of a study on causes that holes are formed in a surface of a semiconductor substrate.
Figure 6B:
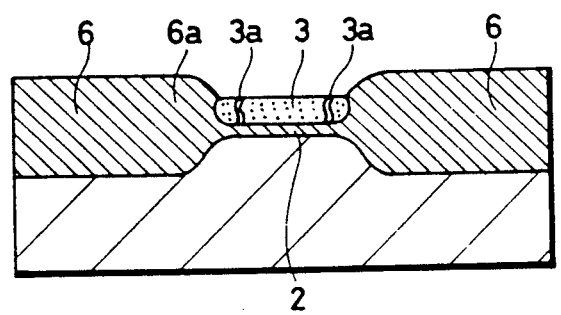
Figure 6C:
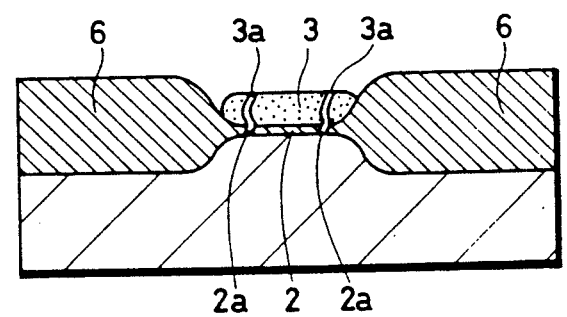
Figure 6D:
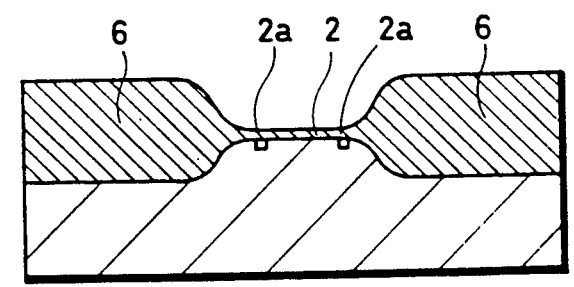
Figure 6E:
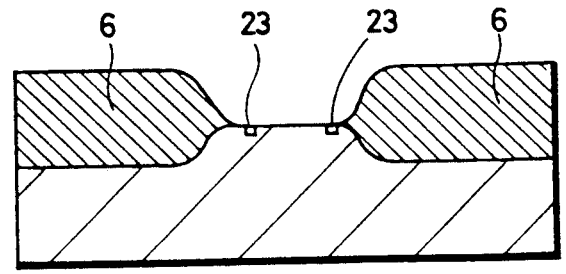
Figure 7:
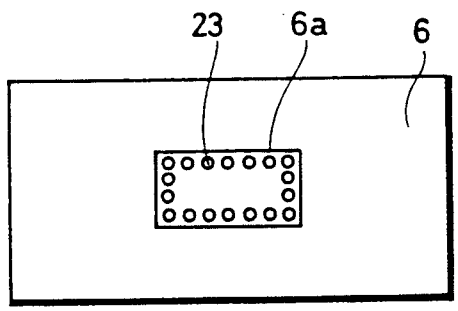
FIG. 7 is a plan view of the semiconductor substrate shown in FIG. 5D.
Figure 8:
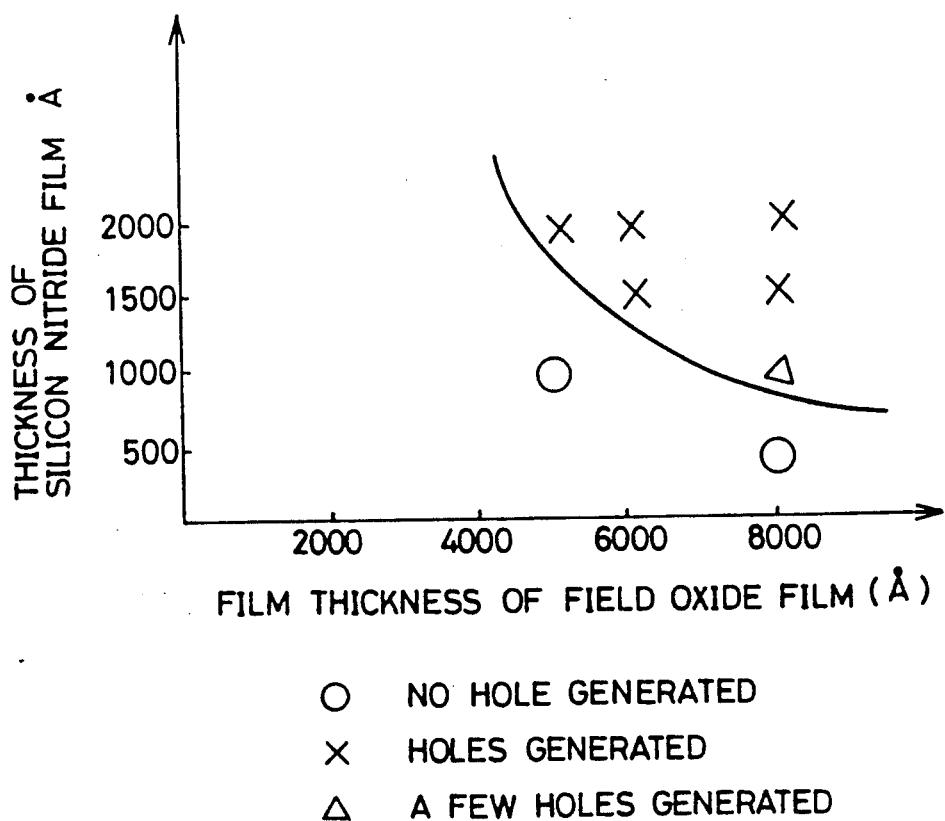
FIG. 8 is a diagram showing the results of a test as to whether any hole has been produced or not in a device region, using a variety of thickness of the field oxide film which has been obtained by varying the thickness of the silicon nitride film.

Thereafter, referring to FIGS. 1L and 1R, an insulating film 24 is formed over the entire surface of the semiconductor substrate 1, whereby an EEPROM is obtained. The EEPROM thus formed is superior in the break-down voltage due to a larger thickness of the field oxide film 6.

While in the embodiment above, a description has been made on a case where an EEPROM is formed in a device region, the present invention can not be limited to the same but be applied to any semiconductor device having a field oxide film.

As has been described in the foregoing, according to the present invention, even if any hole is produced in the unoxidized polysilicon, the underlying oxide film remains left on the main surface of the semiconductor substrate even after the unoxidized polysilicon has been completely etched away, because the time required for etching away the underlying oxide film completely is longer than the time required for etching away the unoxidized polysilicon completely. Therefore, the main surface of the semiconductor substrate can not be subject to any etching. In this manner, the formation of holes in a main surface of a semiconductor substrate in thickening a field oxide film, as it has been seen in the conventional cases, can be avoided. According to the present invention, a field oxide film can be further increased in thickness, resulting in a semiconductor device of a higher-integration level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of device isolation using the polysilicon pad LOCOS method to form a field oxide film for isolating device regions on a main surface of a semiconductor substrate, comprising the steps of:

forming an underlying oxide film on the main surface of the semiconductor substrate;

depositing polysilicon to be said field oxide film on said underlying oxide film;

forming a nitride film on said polysilicon;

patterning said nitride film to leave patterns of a predetermined configuration in an area to be said device region;

thermally oxidizing said polysilicon, using said patterned nitride film as a mask, other than a portion beneath said mask to form said field oxide film on the main surface of said semiconductor substrate wherein said field oxide film is substantially thicker than said underlying oxide film and, during said step of thermally oxidizing, said unoxidized polysilicon tends to develop openings therethrough to the surface of said underlying oxide film and wherein said etching of said unoxidized polysilicon tends, through said openings, to etch said underlying oxide film;

removing said nitride film having served as the mask to expose the unoxidized polysilicon remaining beneath said mask; and removing said unoxidized polysilicon by an etching having a selectivity which meets the following inequality;

$$\frac{T_{SiO2}}{R_{SiO2}} > \frac{T_{poly}}{R_{poly}}$$

to expose a portion of said underlying oxide film surrounded by said field oxide film, wherein, $T_{SiO2}$ represents the film thickness of said underlying oxide film, $R_{SiO2}$ represents the etching rate of the underlying oxide film, $T_{poly}$ represents the film thickness of said unoxidized polysilicon and $R_{poly}$ represents the etching rate of said unoxidized polysilicon.

2. The method according to claim 1, wherein the etching of said unoxidized polysilicon comprises plasma etching.

3. The method according to claim 2, wherein said plasma etching is performed with the use of a mixed gas comprising $CF_4$ and $O_2$ under the conditions of gas pressure of 0.1 to 1.0 Torr, RF power of 0.1 to 1.0 W/cm$^2$ and substrate temperature of 50° C. or less.

4. The method according to claim 3, wherein said plasma etching is performed at a substrate temperature of 20° C. or less.

5. The method according to claim 3, wherein said nitride film is 800 to 2000 Å thick, said polysilicon is 500 to 2000 Å thick and said underlying oxide film is 150 to 500 Å thick.

6. The method according to claim 1, wherein the etching of said unoxidized polysilicon comprises wet etching with alkali aqueous solution.

7. The method according to claim 6, wherein said wet etching is performed at a temperature between 50° and 80° C.

8. The method according to claim 6, wherein said alkali aqueous solution comprises NaOH aqueous solution.

9. The method according to claim 6, wherein said alkali aqueous solution comprises KOH aqueous solution.

10. The method according to claim 1, further comprising the step of:

treating the surface of said semiconductor substrate with hydrofluoric acid solution after the portion of the underlying oxide film surrounded by said field oxide film is exposed.

11. In a method of device isolation using a polysilicon pad LOCOS method to form a thick field oxide for isolating device regions on a main surface of a semiconductor substrate by forming an underlying oxide film on said main surface of said semiconductor substrate, forming a polysilicon layer on said underlying oxide film, forming a nitride film on said polysilicon layer, patterning said nitride film, and, using said nitride film as a mask, thermally oxidizing a region outside said mask to form a field oxide substantially thicker than said underlying oxide film, removing said mask to expose unoxidized polysilicon and then removing said unoxidized polysilicon by etching, wherein, during said step of thermally oxidizing, said unoxidized polysilicon tends to develop openings therethrough to the surface of said underlying oxide film and wherein said etching of said unoxidized polysilicon tends, through said openings, to etch said underlying oxide film, an improvement for preventing formation of any defects in the main surface of said semiconductor substrate beneath said openings caused by etching through said underlying oxide film to said main surface of said semiconductor surface while etching to remove said oxidized polysilicon, comprising the step of:

selecting etching conditions such that time of etching through said unoxidized polysilicon to said underlying oxide film is less than time of etching through said underlying oxide film to said main surface of said semiconductor substrate during said step of etching to remove said unoxidized polysilicon.

12. The process of claim 11, wherein said etching conditions include etching selectivity meeting the following inequality:

$$\frac{T_{SiO2}}{R_{SiO2}} > \frac{T_{poly}}{R_{poly}}$$

wherein, $T_{SiO2}$ represents the film thickness of said underlying oxide film, $R_{SiO2}$ represents the etching rate of the underlying oxide film, $T_{poly}$ represents the film thickness of said unoxidized polysilicon and $R_{poly}$ represents the etching rate of said unoxidized polysilicon.

13. In a process of forming regions of a thick field oxide by a polysilicon pad LOCOS method wherein after formation of said regions of thick field oxide, an underlying oxide film substantially thinner than said regions of thick field oxide is present on a main surface of a semiconductor substrate between said regions of thick field oxide, unoxidized polysilicon is present on said underlying oxide film and a nitride film is present on said unoxidized polysilicon, said unoxidized polysilicon tending to have openings formed therein and extending to said underlying oxide film, a method of removing said unoxidized polysilicon by etching without damaging said main surface of said semiconductor substrate as a result of etching, via said openings, said underlying oxide film to said main surface of said semiconductor substrate, comprising the step of:

selecting etching conditions for etching away said unoxidized polysilicon to prevent complete penetration of said underlying oxide layer prior to complete removal of said unoxidized polysilicon.

14. The process of claim 13, wherein said etching conditions include etching selectively meeting the following inequality:

$$\frac{T_{SiO2}}{R_{SiO2}} > \frac{T_{poly}}{R_{poly}}$$

wherein, $T_{SiO2}$ represents the film thickness of said underlying oxide film, $R_{SiO2}$ represents the etching rate of the underlying oxide film, $T_{poly}$ represents the film thickness of said unoxidized polysilicon and $R_{poly}$ represents the etching rate of said unoxidized polysilicon.

15. In a process of forming a thick field oxide for device isolation using a polysilicon pad LOCOS method, wherein an underlying oxide film is formed on a main surface of a semiconductor substrate, a polysilicon layer is formed on said underlying oxide film and a nitride film is formed on said polysilicon layer, wherein, after formation of said thick field oxide, unoxidized which is substantially thicker than said underlying oxide film polysilicon remains on a portion of said underlying oxide film, said unoxidized polysilicon tending to form openings extending to said underlying oxide film, and wherein said unoxidized polysilicon is etched following formation of said thick field oxide, a method of preventing damage to said main surface of said semiconductor substrate resulting from etching through said underlying oxide film to said main surface of said semiconductor substrate, via said openings, during etching to remove said unoxidized polysilicon, comprising the step of:

forming said underlying oxide film and said polysilicon layer to have, respectively, first and second predefined thicknesses such that, depending upon etching rates for said underlying oxide film and said polysilicon layer, time required for etching completely through said underlying oxide film of said first predefined thickness is greater than time for completely etching through said polysilicon layer of said second predefined thickness.

* * * * *